United States Patent
Yoo

(10) Patent No.: US 10,382,046 B2
(45) Date of Patent: Aug. 13, 2019

(54) DIGITAL PHASE LOCKED LOOP

(71) Applicant: INDUSTRY-UNIVERSITY COOPERATION FOUNDATION HANYANG UNIVERSITY, Seoul (KR)

(72) Inventor: Chang Sik Yoo, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/779,119

(22) PCT Filed: Nov. 10, 2016

(86) PCT No.: PCT/KR2016/012911
§ 371 (c)(1),
(2) Date: May 25, 2018

(87) PCT Pub. No.: WO2017/099368
PCT Pub. Date: Jun. 15, 2017

(65) Prior Publication Data
US 2018/0351562 A1    Dec. 6, 2018

(30) Foreign Application Priority Data

Dec. 9, 2015    (KR) .................. 10-2015-0175097

(51) Int. Cl.
*G04F 10/00*    (2006.01)
*H03L 7/089*    (2006.01)
(Continued)

(52) U.S. Cl.
CPC ............ *H03L 7/0992* (2013.01); *G04F 10/00* (2013.01); *G04F 10/005* (2013.01); *H03L 7/089* (2013.01);
(Continued)

(58) Field of Classification Search
None
See application file for complete search history.

(56) References Cited

U.S. PATENT DOCUMENTS 7,791,428 B2 *   9/2010  Chang ............... H03L 7/085
                                              331/1 A
8,031,007 B2 *  10/2011  Chang ............... H03L 7/085
                                              331/1 A
(Continued)

FOREIGN PATENT DOCUMENTS

KR    10-2009-0033783 A    4/2009
KR    10-2010-0062893 A    6/2010
(Continued)

OTHER PUBLICATIONS

International Search Report for PCT/KR2016/012911 dated Jan. 26, 2017 [PCT/ISA/210].

*Primary Examiner* — Berhanu Tadese
(74) *Attorney, Agent, or Firm* — Sughrue Mion, PLLC

(57) ABSTRACT

A digital phase locked loop realizing high bandwidth is disclosed. The digital locked loop generates a first digital code corresponding to a difference between a rising edge of a reference signal and a rising edge of a feedback signal and a second digital code corresponding to a difference between a falling edge of the reference signal and a falling edges of the feedback signal, generates a third digital code by adding the first digital code and the second digital code, generates a first frequency control code at the rising edge of the reference signal and a second frequency control code at the falling edge of the reference signal by filtering the third digital code, outputs a specific frequency depending on the first frequency control code and the second frequency control code.

4 Claims, 7 Drawing Sheets

(51) Int. Cl.
*H03L 7/093* (2006.01)
*H03L 7/099* (2006.01)

(52) U.S. Cl.
CPC ............ *H03L 7/0891* (2013.01); *H03L 7/093* (2013.01); *H03L 7/099* (2013.01)

(56) References Cited

U.S. PATENT DOCUMENTS

| | | | | |
|---|---|---|---|---|
| 8,193,866 B2* | 6/2012 | Chang | ..................... | H03L 7/085 327/150 |
| 8,228,128 B2* | 7/2012 | Chang | ..................... | H03L 7/085 327/159 |
| 8,289,086 B2* | 10/2012 | Chen | ..................... | H03K 3/03 331/1 A |
| 8,395,453 B2* | 3/2013 | Chang | ..................... | H03L 7/085 327/150 |
| 8,674,244 B2* | 3/2014 | Kim | ..................... | G04F 10/005 178/20.04 |
| 8,890,624 B2* | 11/2014 | Chen | ..................... | H03K 3/03 327/150 |
| 9,041,443 B2* | 5/2015 | Jang | ..................... | H03L 7/085 327/147 |
| 9,270,290 B2* | 2/2016 | Tsai | ..................... | G04F 10/005 |
| 9,362,936 B1* | 6/2016 | Caffee | ..................... | H03K 5/135 |
| 9,450,594 B2* | 9/2016 | Kim | ..................... | G04F 10/005 |
| 9,531,394 B1* | 12/2016 | Caffee | ..................... | H03L 7/091 |
| 9,543,970 B2* | 1/2017 | Liu | ..................... | H03L 7/0992 |
| 9,588,497 B1* | 3/2017 | Monk | ..................... | G04F 10/005 |
| 9,632,486 B2* | 4/2017 | Tsai | ..................... | H03L 7/085 |
| 9,634,678 B1* | 4/2017 | Caffee | ..................... | H03L 7/187 |
| 9,705,521 B1* | 7/2017 | Monk | ..................... | H03M 1/66 |
| 10,097,187 B2* | 10/2018 | Doare | ..................... | G01S 7/35 |
| 2007/0082635 A1* | 4/2007 | Gehring | ..................... | H03L 7/0802 455/180.3 |
| 2009/0096535 A1* | 4/2009 | Chang | ..................... | H03L 7/085 331/17 |
| 2009/0096538 A1* | 4/2009 | Chang | ..................... | H03L 7/085 331/1 A |
| 2009/0096539 A1* | 4/2009 | Chang | ..................... | H03L 7/085 331/1 A |
| 2009/0097609 A1* | 4/2009 | Chang | ..................... | H03L 7/085 375/376 |
| 2009/0251225 A1* | 10/2009 | Chen | ..................... | H03K 3/03 331/1 A |
| 2010/0277244 A1* | 11/2010 | Chang | ..................... | H03L 7/085 331/16 |
| 2011/0148490 A1* | 6/2011 | Lee | ..................... | H03L 7/085 327/159 |
| 2012/0161831 A1* | 6/2012 | Ravi | ..................... | H03L 7/085 327/156 |
| 2012/0306553 A1* | 12/2012 | Kim | ..................... | H03M 1/06 327/158 |
| 2013/0027102 A1* | 1/2013 | Chen | ..................... | H03K 3/03 327/158 |
| 2014/0086275 A1* | 3/2014 | Kim | ..................... | H03M 1/06 374/170 |
| 2014/0266341 A1* | 9/2014 | Jang | ..................... | H03L 7/085 327/156 |
| 2015/0194971 A1* | 7/2015 | Tsai | ..................... | H03L 7/085 327/142 |
| 2016/0156363 A1* | 6/2016 | Tsai | ..................... | H03L 7/085 327/142 |
| 2016/0308541 A1* | 10/2016 | Liu | ..................... | H03L 7/0992 |
| 2016/0373120 A1* | 12/2016 | Caffee | ..................... | H03L 7/091 |
| 2018/0145692 A1* | 5/2018 | Doare | ..................... | G01S 7/35 |
| 2019/0068205 A1* | 2/2019 | Tamura | ..................... | H03L 7/08 |

FOREIGN PATENT DOCUMENTS

| | | | | |
|---|---|---|---|---|
| KR | 10-2011-0070719 A | 6/2011 | | |
| KR | 10-2015-0069497 A | 6/2015 | | |
| KR | 20150069497 A * | 6/2015 | | |
| WO | WO-2017065510 A1 * | 4/2017 | ............. | H03L 7/089 |
| WO | WO-2017099368 A1 * | 6/2017 | ............. | G04F 10/00 |

* cited by examiner

DIGITAL PHASE LOCKED LOOP

CROSS REFERENCE TO RELATED APPLICATIONS

This application is a National Stage of International Application No. PCT/KR2016/012911, filed on Nov. 10, 2016, which claims priority from Korean Patent Application No. 10-2015-0175097, filed on Dec. 9, 2015.

BACKGROUND

1. Field of the Invention

The present disclosure relates to a phase locked loop realizing high bandwidth using a rising edge and a falling edge of a reference signal and a feedback signal.

2. Description of the Related Art

A phase locked loop PLL is a frequency feedback circuit for generating an output signal with desired frequency and phase in response to a reference signal (clock signal) inputted from an external device, and it has been widely used in a frequency synthesizer or a clock recovery circuit, etc.

FIG. 1 is a view illustrating schematically a charge pump type phase locked loop as an example of a conventional analog phase locked loop.

In FIG. 1, the conventional analog phase locked loop 100 includes a phase frequency detector (PFD) 110, a charge pump (CP 120), a loop filter 130 and a voltage control oscillator 140.

The phase frequency detector 110 outputs a phase difference signal by comparing a reference signal with a feedback signal. The charge pump 120 supplies charges in proportion to a pulse width of the phase difference signal, and the loop filter 130 changes a voltage according to change of amount of charged charges. The voltage control oscillator 140 outputs a signal having a specific frequency depending on the changed voltage, i.e. control voltage. The signal outputted from the voltage control oscillator 150 is inputted to the phase frequency detector 110 by feedback. The phase frequency detector 110 compares generally only one of a rising edge or a falling edge of the reference signal and the feedback signal, and outputs the signal in proportion to the phase difference of the reference signal and the feedback signal.

The analog phase locked loop 100 may include further a divider (not shown). The divider locates on a feedback path, and divides a frequency of the signal outputted from the voltage control oscillator 150.

In the conventional analog phase locked loop 100, the bandwidth of the analog phase locked loop 100 should be widened so as to enhance detection velocity of phase and frequency. However, the bandwidth of the phase locked loop 100 is limited to ¹/₁₀ or less of a frequency of the reference signal to assure stability of the phase locked loop 100, due to a sampling operation of detecting the phase difference at the rising edge or the falling edge of the reference signal and the feedback signal.

FIG. 2 is a view illustrating schematically conventional digital phase locked loop.

In FIG. 2, the conventional digital phase locked loop 200 includes a time-to-digital converter (TDC) 210, a digital loop filter (DLF) 220 and a digitally controlled oscillator (DCO) 230.

The TDC 210 outputs a digital code corresponding to phase difference between rising edges of a reference signal and a feedback signal. The digital loop filter 220 provides a digital code for controlling a frequency of the digitally controlled oscillator 230 by low-pass-filtering the digital code outputted from the TDC 210.

The digital phase locked loop 200 may include further also a divider (not shown). The divider locates on a feedback path, and divides a frequency of the signal outputted from the digitally controlled oscillator 230.

FIG. 3 is a view illustrating conceptually operation waveform of the digital phase locked loop in FIG. 2.

In FIG. 3, it is assumed that the TDC 210 outputs a digital code corresponding to negative decimal number when the rising edge of the feedback signal precedes the rising edge of the reference signal, and outputs a digital code corresponding to positive decimal number when the rising edge of the feedback signal follows the rising edge of the reference signal.

Since the rising edge of the feedback signal precedes the rising edge of the reference signal, the TDC 210 outputs the digital code corresponding to the negative decimal number, and an absolute value of an output of the TDC 210 reduces because phase difference between the rising edges of the signals reduces according as a time lapses. The digital loop filter 220 low-pas-filters the output of the TDC 210, thereby controlling the frequency of the digitally controlled oscillator 230 once every period.

However, the bandwidth of the conventional digital phase locked loop 200 is also limited to ¹/₁₀ or less of a frequency of the reference signal so as to assure stability, like the analog phase locked loop.

SUMMARY

The bandwidth of the conventional digital phase locked loop is limited to ¹/₁₀ or less of a frequency of a reference signal as described above. An aspect of the invention provides a digital phase locked loop for comparing both of rising edges and falling edges of a reference signal and a feedback signal, thereby assuring stability though the phase locked loop has a bandwidth of ¹/₁₀ or more of a frequency of the reference signal.

Other features of the invention may be thought by a person in an art through following embodiments.

According to one embodiment of the invention, a digital locked loop controls a frequency of a digitally controlled oscillator by using phase difference between rising edges of a reference signal and a feedback signal and phase difference between falling edges of the reference signal and the feedback signal.

The digital phase locked loop includes a time-digital converter unit configured to output a first digital code corresponding to a rising edge phase difference signal including phase difference between rising edges of the reference signal and the feedback signal and a second digital code corresponding to a falling edge phase difference signal including phase difference between falling edges of the reference signal and the feedback signal; a digital adder configured to output a third digital code by adding the first digital code and the second digital code; a digital loop filter unit configured to output a first frequency control code at the rising edge of the reference signal and a second frequency control code at the falling edge of the reference signal by filtering the third digital code; and a digitally controlled oscillator configured to output a specific frequency depending on the first frequency control code and the second frequency control code.

The time-digital converter unit outputs the first digital code and the second digital code in a period of the reference signal.

The time-digital converter unit includes a time-digital converter A configured to receive the reference signal and the feedback signal and output the first digital code by using the received reference signal and the received feedback signal; a NOT circuit A configured to perform a NOT operation about the reference signal; a NOT circuit B configured to perform a NOT operation about the feedback signal; and a time-digital converter B configured to receive an output value of the NOT circuit A and an output value of the NOT circuit B, and output the second digital code by using the received output values.

The digital loop filter includes a digital loop filter A configured to output the first frequency control code by filtering the third digital code based on the reference signal; and a digital loop filter B configured to output the second frequency control code by filtering the third digital code based on an inverted signal of the reference signal.

According to another embodiment of the invention, a digital phase locked loop comprises a time-digital converter unit configured to output a first digital code corresponding to a rising edge phase difference signal including phase difference between rising edges of the reference signal and the feedback signal and a second digital code corresponding to a falling edge phase difference signal including phase difference between falling edges of the reference signal and the feedback signal; a digital adder configured to output a third digital code by adding the first digital code and the second digital code; a digital loop filter unit configured to output a frequency control code by low-pass-filtering the third digital code; and a digitally controlled oscillator configured to output a specific frequency depending on the frequency control code.

A digital locked loop of the invention may achieve high bandwidth by using rising edges and falling edges of a reference signal and a feedback signal.

BRIEF DESCRIPTION OF DRAWINGS

The aspects, features, advantages and embodiments of the invention will be more apparent from the following detailed description taken in conjunction with reference to the accompanying drawings, in which.

DETAILED DESCRIPTION

In the present specification, an expression used in the singular encompasses the expression of the plural, unless it has a clearly different meaning in the context. In the present specification, terms such as "comprising" or "including," etc., should not be interpreted as meaning that all of the elements or operations are necessarily included. That is, some of the elements or operations may not be included, while other additional elements may be further included. Also, terms such as "unit," "module," etc., as used in the present specification may refer to a part for processing at least one function or action and may be implemented as hardware, software, or a combination of hardware and software.

Hereinafter, embodiments of the invention will be described in detail with reference to accompanying drawings.

Figure 1:
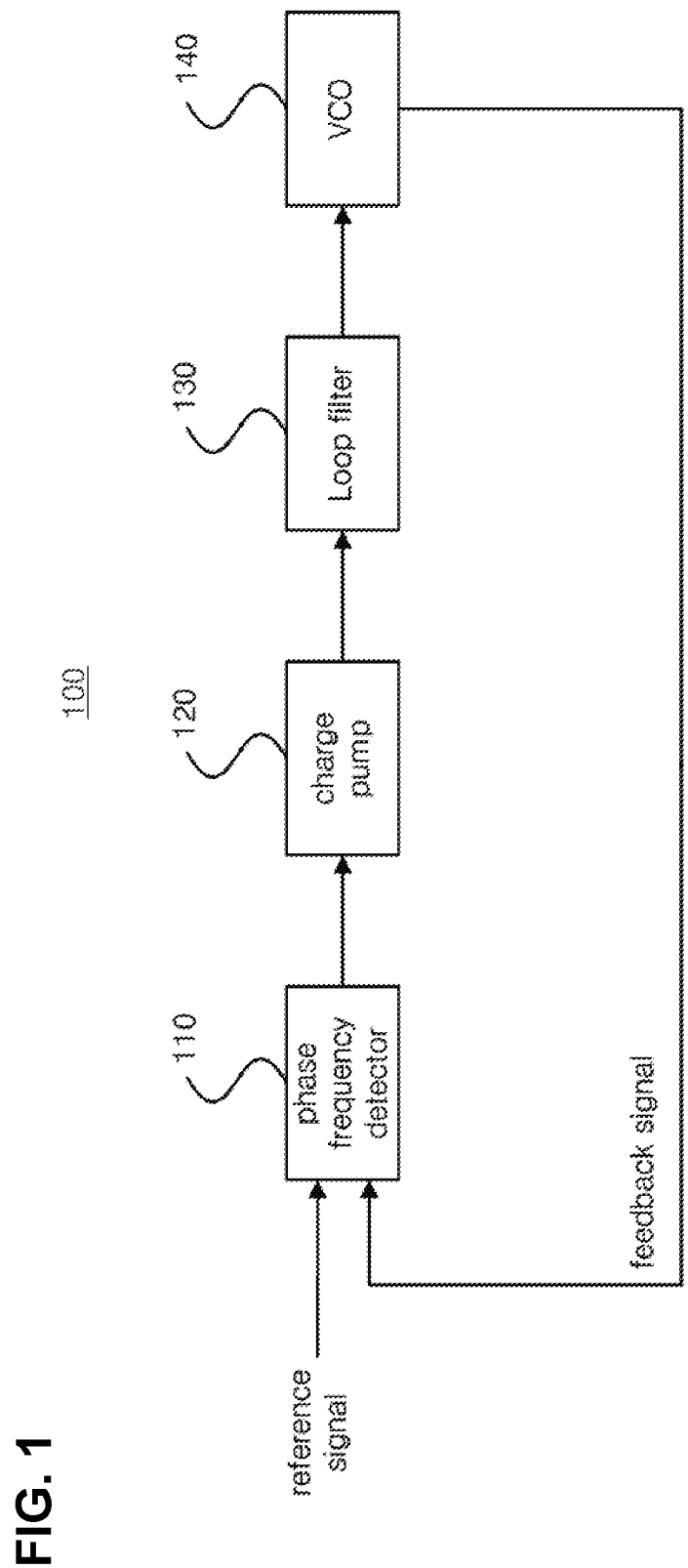
FIG. 1 is a view illustrating schematically a charge pump type phase locked loop as an example of a conventional analog phase locked loop.
Figure 2:
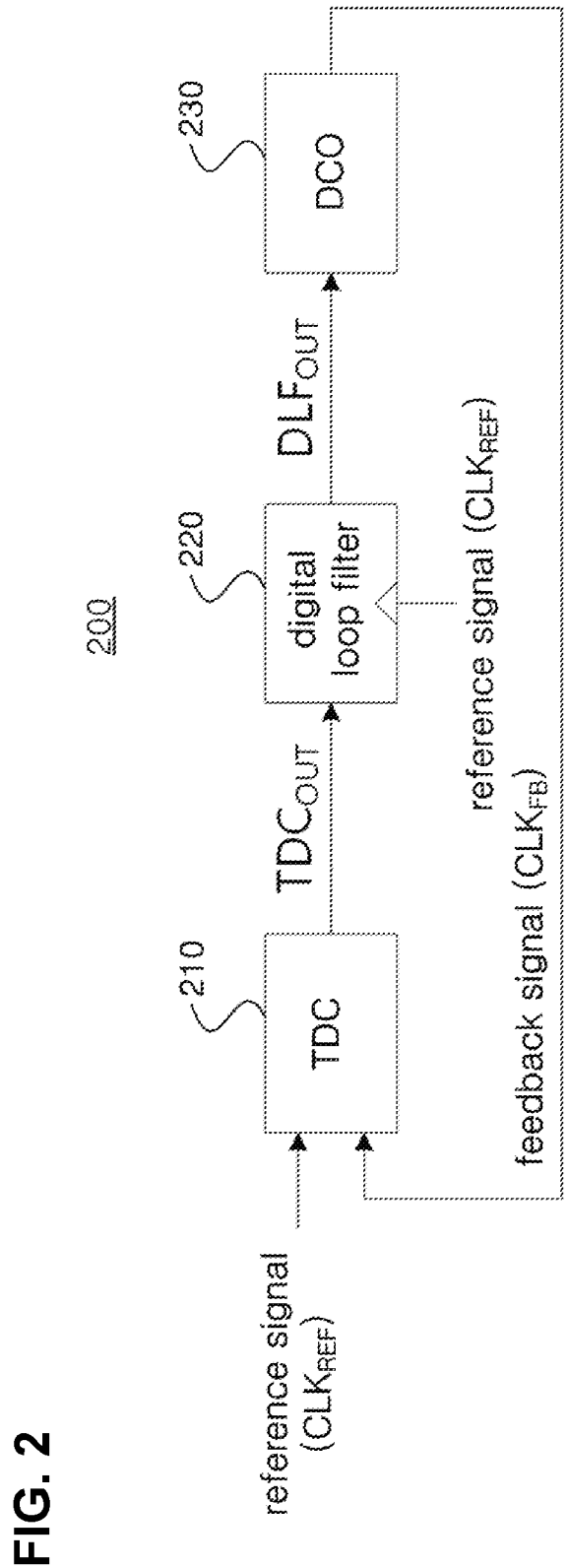
FIG. 2 is a view illustrating schematically conventional digital phase locked loop.
Figure 3:
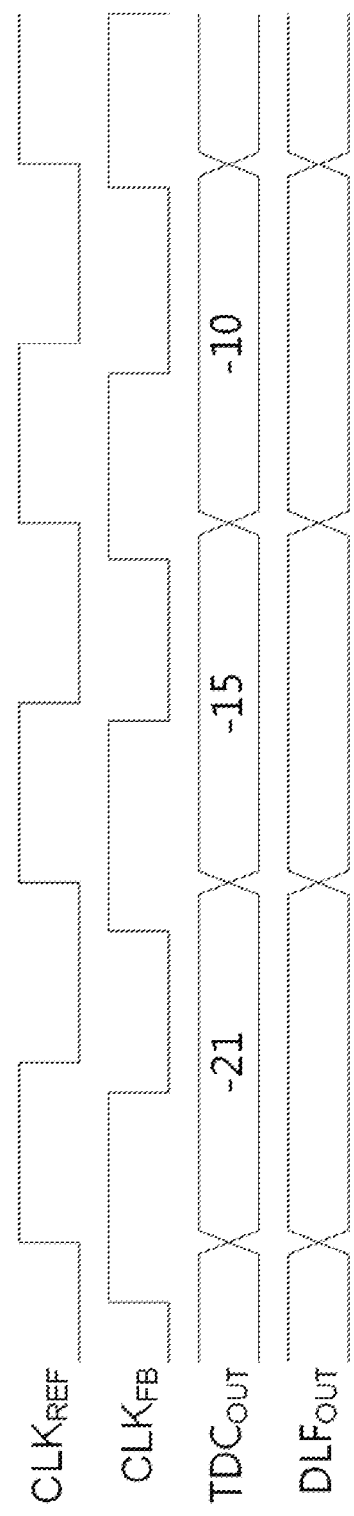
FIG. 3 is a view illustrating conceptually operation waveform of the digital phase locked loop in FIG. 2.
Figure 4:
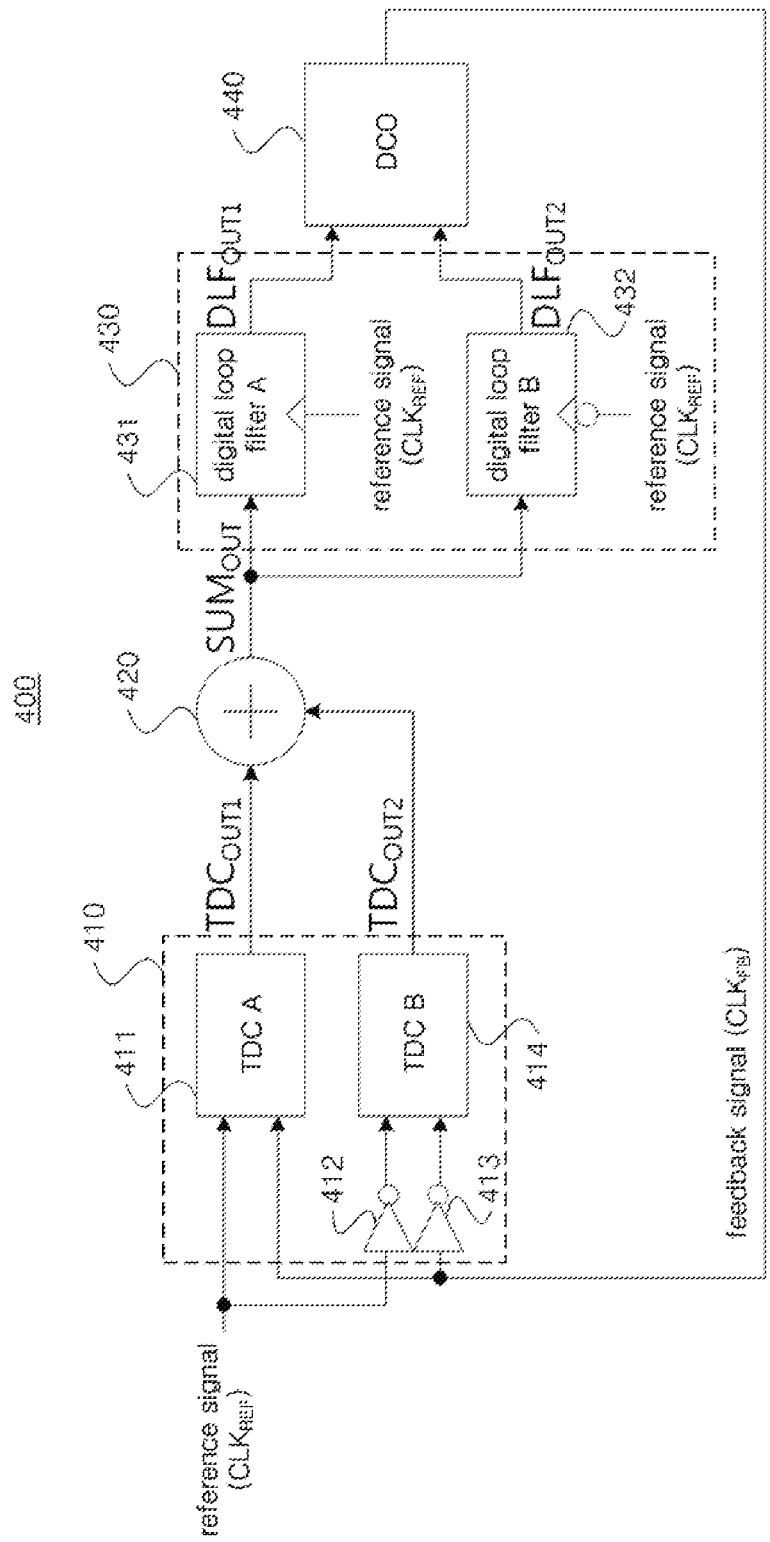
FIG. 4 is a view illustrating schematically a digital phase locked loop according to one embodiment of the invention.

FIG. 4 is a view illustrating schematically a digital phase locked loop according to one embodiment of the invention.

In FIG. 4, the digital phase locked loop 400 of the present embodiment includes a time-to-digital converter (TDC) unit 410, a digital adder 420, a digital loop filter (DLF) unit 430 and a digitally controlled oscillator (DCO) 440.

The TDC unit 410 compares a reference signal with a feedback signal, and outputs a digital code corresponding to phase difference of the reference signal and the feedback signal according to the comparing result.

Here, the feedback signal may be a signal outputted from the digitally controlled oscillator 440 as shown in FIG. 4. In another embodiment, the digital phase locked loop 400 may further include a divider (not shown) which locates on a feedback path and divides the signal outputted from the digitally controlled oscillator 440, and the feedback signal may be a signal outputted from the divider.

Particularly, the TDC unit 410 outputs a first digital code corresponding to a rising edge phase difference signal including phase difference between the rising edges of the reference signal and the feedback signal and a second digital code corresponding to a falling edge phase difference signal including phase difference between the falling edges of the reference signal and the feedback signal. That is, the TDC unit 410 outputs the first digital code and the second digital code in a period of the reference signal. For this operation, the TDC unit 410 includes two time-digital converters.

More particularly, the TDC unit 410 includes a TDC A 411, a NOT circuit A 412, a NOT circuit B 413 and a TDC B 414.

The TDC A 411 receives the reference signal $CLK_{REF}$ and the feedback signal $CLK_{FB}$, and outputs the first digital code $TDC_{OUT1}$ corresponding to the rising edge phase difference signal by using the received reference signal $CLK_{REF}$ and the received feedback signal $CLK_{FB}$.

The NOT circuit A 412 performs a NOT operation about inputted reference signal $CLK_{REF}$, and the NOT circuit B 413 performs a NOT operation about inputted feedback signal $CLK_{FB}$. The TDC B 414 receives an output value of the NOT circuit A 412 and an output value of the NOT circuit B 413, and outputs the second digital code $TDC_{OUT2}$ corresponding to the falling edge phase difference signal by using the inputted output values. That is, the TDC B 414 receives an inverted reference signal $CLK_{REF}$ and an inverted feedback signal $CLK_{FB}$, and outputs the second digital code $TDC_{OUT2}$ corresponding to an inverted falling edge phase difference signal.

The digital adder 420 outputs a third digital code $SUM_{OUT}$ by performing an adding operation about the first digital code $TDC_{OUT1}$ and the second digital code $TDC_{OUT2}$. The digital adder 420 is used for locking when duty rate differs.

The digital loop filter unit 430 outputs (i.e. update) a first frequency control code $DLF_{OUT1}$ at the rising edge of the reference signal $CLK_{REF}$ and a second frequency control code $DLF_{OUT2}$ at the falling edge of the reference signal $CLK_{REF}$ by filtering, e.g. low-pass-filtering the third digital code $SUM_{OUT}$.

Particularly, the digital loop filter unit 430 includes a digital loop filter A 431 for outputting the first frequency control code $DLF_{OUT1}$ by low-pass-filtering the third digital code $SUM_{OUT}$ under control of the reference signal $CLK_{REF}$ and a digital loop filter B 432 for outputting the second frequency control code $DLF_{OUT2}$ by filtering the third digital code $SUM_{OUT}$ under control of an inverted signal of the reference signal $CLK_{REF}$.

Figure 5:
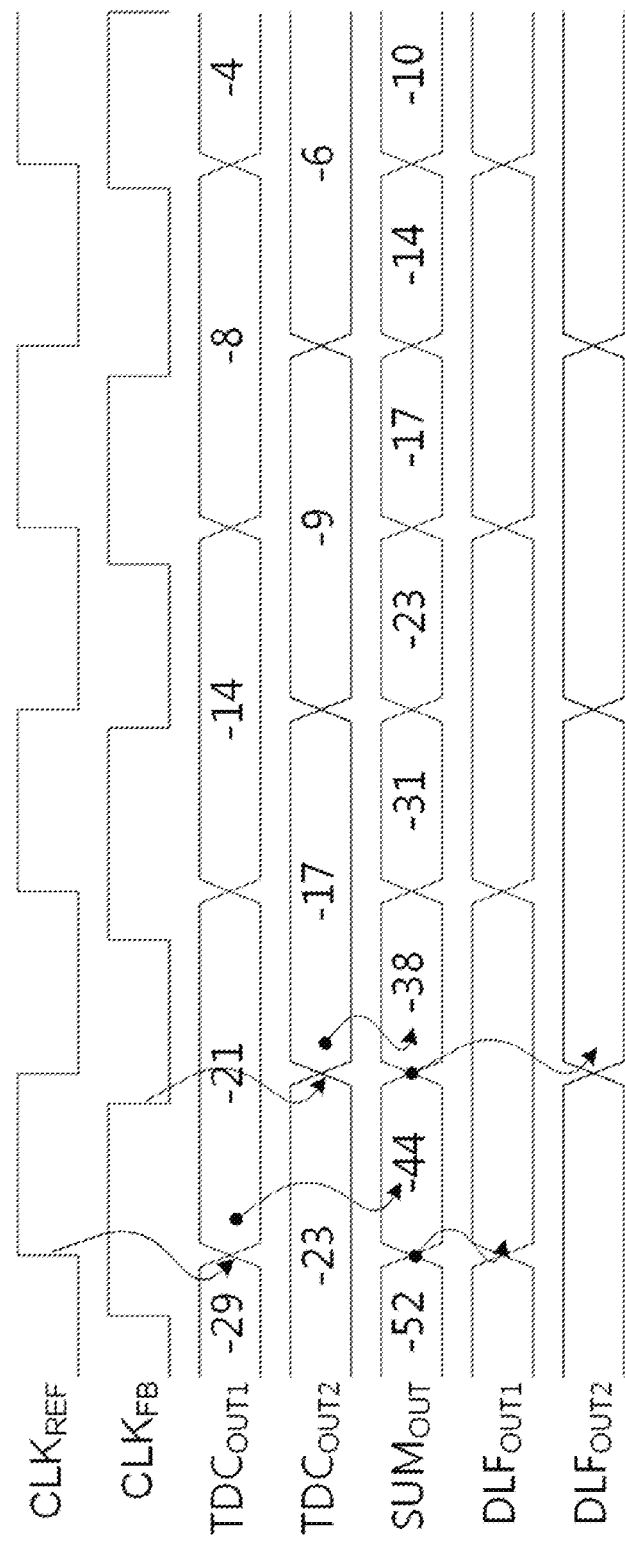
FIG. 5 is a view illustrating schematically a digital loop filter according to one embodiment of the invention.

On the other hand, the digital loop filters 431 and 432 may be modified as various circuits, and may be realized in a proportional path having a gain $k_p$ and an internal path having a gain $k_i$ as shown in FIG. 5. This may be applied commonly to the conventional digital phase locked loop and the digital phase locked loop 400 of the invention.

The digitally controlled oscillator 440 outputs a signal having a specific frequency depending on the first frequency control code $DLF_{OUT1}$ and the second frequency control code $DLF_{OUT2}$.

In one embodiment, the digital phase locked loop 400 updates two times the frequency of the digitally controlled oscillator 440 every a period of the reference signal $CLK_{REF}$.

Hereinafter, an operation of the digital phase locked loop 400 will be described in more detailed with reference to drawings FIG. 6 and FIG. 7.

Figure 6:
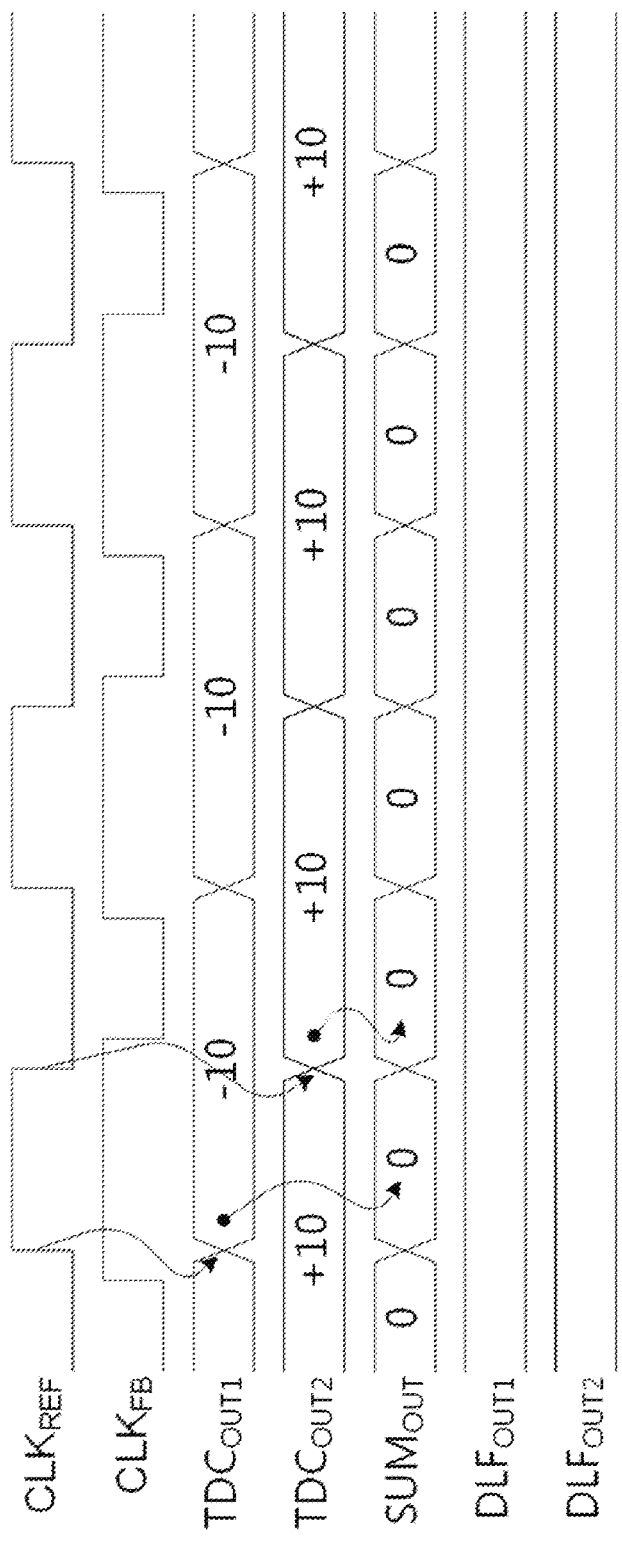
FIG. 6 is a view illustrating operation waveform under unlock state of the digital phase locked loop according to one embodiment of the invention.

FIG. 6 is a view illustrating operation waveform under unlock state of the digital phase locked loop according to one embodiment of the invention.

It is assumed that the TDC 410 outputs a digital code corresponding to negative decimal number when the rising edge of the feedback signal $CLK_{FB}$ precedes the rising edge of the reference signal $CLK_{REF}$, and outputs a digital code corresponding to positive decimal number when the rising edge of the feedback signal $CLK_{FB}$ follows the rising edge of the reference signal $CLK_{REF}$. It is assumed that duty rate of the feedback signal $CLK_{FB}$ is different from that of the reference signal $CLK_{REF}$, and the rising edge and the falling edge of the feedback signal $CLK_{FB}$ precedes those of the reference signal $CLK_{REF}$.

In this case, each of the TDC A 411 and the TDC B 414 outputs a digital code corresponding to negative decimal number. The third digital code $SUM_{OUT}$ outputted from the digital adder 420 is updated at the rising edge and the falling edge of the reference signal $CLK_{REF}$. The digital loop filter A 431 updates the first frequency control code $DLF_{OUT1}$ which is a frequency control code of the digitally controlled oscillator 440 at the rising edge of the reference signal $CLK_{REF}$, and the digital loop filter B 432 updates the second frequency control code $DLF_{OUT2}$ as another frequency control code at the falling edge of the reference signal $CLK_{REF}$.

Figure 7:
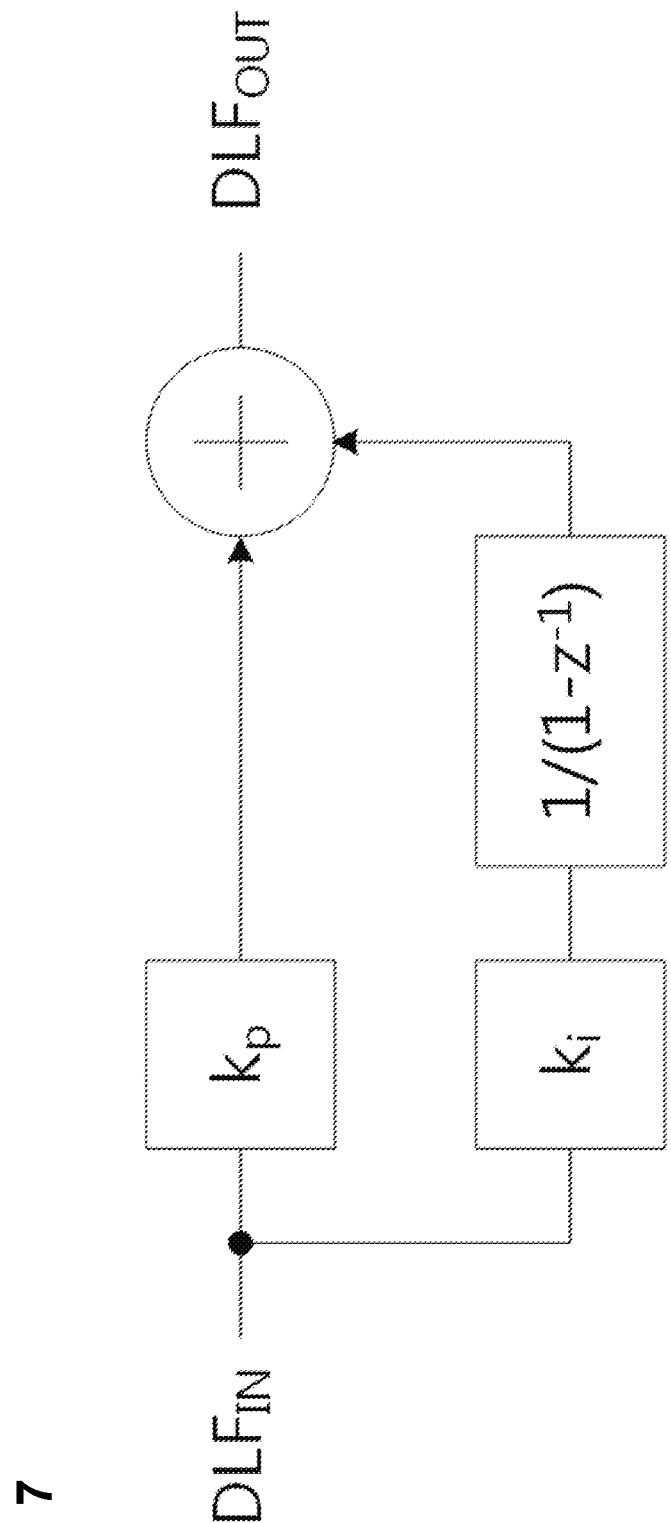
FIG. 7 is a view illustrating operation waveform under lock state of the digital locked loop according to one embodiment of the invention.

FIG. 7 is a view illustrating operation waveform under lock state of the digital locked loop according to one embodiment of the invention.

The digital phase locked loop 400 operates like the waveform in FIG. 5, but the outputs of the digital loop filter A 431 and the digital loop filter B 432 are not changed though a period of time lapses because the digital phase locked loop 400 is in the lock state. In the event that the duty rate of the reference signal $CLK_{REF}$ is not identical to that of the feedback signal $CLK_{FB}$, the digital phase locked loop 400 is locked under the condition that the outputs of the TDC A 411 and the TDC B 412 have opposite polarity and absolute values of the outputs are the same as shown in FIG. 6. That is, the digital phase locked loop 400 is locked under the condition that absolute value of the phase difference between the rising edges of the reference signal $CLK_{REF}$ and the feedback signal $CLK_{FB}$ is identical to that between the falling edges of the reference signal $CLK_{REF}$ and the feedback signal $CLK_{FB}$ and the phase difference between the rising edges and the phase difference between the falling edges have opposite polarity.

Briefly, the digital phase locked loop 400 of the invention controls the frequency of the digitally controlled oscillator 440 by using the phase difference between the rising edges of the reference signal $CLK_{REF}$ and the feedback signal $CLK_{FB}$ and the phase difference between the falling edges of the reference signal $CLK_{REF}$ and the feedback signal $CLK_{FB}$, and so the bandwidth of the digital phase locked loop 400 may be increased up to maximum ⅕.

In another embodiment, the digital loop filter 430 may output a frequency control code by low-pass-filtering the third digital code $SUM_{OUT}$, which is not shown in FIG. 4. In this case, the digitally controlled oscillator 440 may output a specific frequency based on the frequency control code.

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

What is claimed is:

1. A digital phase locked loop comprising:
   a time-digital converter unit configured to output a first digital code corresponding to a rising edge phase difference signal including phase difference between rising edges of a reference signal and a feedback signal and a second digital code corresponding to a falling edge phase difference signal including phase difference between falling edges of the reference signal and the feedback signal;
   a digital adder configured to output a third digital code by adding the first digital code and the second digital code;
   a digital loop filter unit configured to output a first frequency control code at the rising edges of the reference signal and a second frequency control code at the falling edges of the reference signal by filtering the third digital code; and
   a digitally controlled oscillator configured to output a specific frequency depending on the first frequency control code and the second frequency control code,
   wherein the time-digital converter unit includes:
   a time-digital converter A configured to receive the reference signal and the feedback signal and output the first digital code by using the received reference signal and the received feedback signal;
   a NOT circuit A configured to perform a NOT operation about the reference signal;
   a NOT circuit B configured to perform a NOT operation about the feedback signal; and
   a time-digital converter B configured to receive an output value of the NOT circuit A and an output value of the NOT circuit B, and output the second digital code by using the received output values.

2. The digital phase locked loop of claim 1, wherein the time-digital converter unit outputs the first digital code and the second digital code in a period of the reference signal.

3. The digital phase locked loop of claim 1, wherein the digital loop filter unit includes:

a digital loop filter A configured to output the first frequency control code by filtering the third digital code based on the reference signal; and a digital loop filter B configured to output the second frequency control code by filtering the third digital code based on an inverted signal of the reference signal.

4. A digital phase locked loop comprising:

a time-digital converter unit configured to output a first digital code corresponding to a rising edge phase difference signal including phase difference between rising edges of the reference signal and the feedback signal and a second digital code corresponding to a falling edge phase difference signal including phase difference between falling edges of the reference signal and the feedback signal;

a digital adder configured to output a third digital code by adding the first digital code and the second digital code;

a digital loop filter unit configured to output a frequency control code by low-pass-filtering the third digital code; and a digitally controlled oscillator configured to output a specific frequency depending on the frequency control code, wherein the time-digital converter unit includes:

a time-digital converter A configured to receive the reference signal and the feedback signal and output the first digital code by using the received reference signal and the received feedback signal;

a NOT circuit A configured to perform a NOT operation about the reference signal;

a NOT circuit B configured to perform a NOT operation about the feedback signal; and a time-digital converter B configured to receive an output value of the NOT circuit A and an output value of the NOT circuit B, and output the second digital code by using the received output values.

* * * * *